(12) United States Patent
Taketsuna et al.

(10) Patent No.: US 8,916,964 B2
(45) Date of Patent: Dec. 23, 2014

(54) SEMICONDUCTOR DEVICE AND METHOD OF PRODUCING SAME

(75) Inventors: Yasuji Taketsuna, Okazaki (JP); Eisaku Kakiuchi, Toyota (JP); Katsuhiko Tatebe, Seto (JP); Masahiro Morino, Okazaki (JP); Tomohiro Takenaga, Toyota (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 125 days.

(21) Appl. No.: 13/511,543

(22) PCT Filed: Nov. 27, 2009

(86) PCT No.: PCT/JP2009/070008
§ 371 (c)(1),
(2), (4) Date: May 23, 2012

(87) PCT Pub. No.: WO2011/064873
PCT Pub. Date: Jun. 3, 2011

(65) Prior Publication Data
US 2012/0280383 A1    Nov. 8, 2012

(51) Int. Cl.
H01L 23/34 (2006.01)
H01L 23/00 (2006.01)
H01L 21/48 (2006.01)
H01L 23/473 (2006.01)

(52) U.S. Cl.
CPC ............ H01L 23/473 (2013.01); H01L 24/32 (2013.01); H01L 2924/13055 (2013.01); H01L 2224/83385 (2013.01); H01L 2224/29101 (2013.01); H01L 2224/83101 (2013.01);
(Continued)

(58) Field of Classification Search
CPC ..... H01L 23/473; H01L 23/427; H01L 21/48; H01L 23/46

USPC ............ 257/712, 713, 714, 717, 720, E23.08, 257/E23.087, E23.088, E23.097, E23.098; 438/712, 713, 714, 717, 720, E23.08, 438/E23.087, E23.088, E23.097, E23.098, 438/121, 12, 122
See application file for complete search history.

(56) References Cited

U.S. PATENT DOCUMENTS 6,414,867 B2 * 7/2002 Suzuki et al. .................. 363/141
2004/0061218 A1 * 4/2004 Tilton et al. .................... 257/710
(Continued)

FOREIGN PATENT DOCUMENTS

JP    09-275170 A    10/1997
JP    H10-104297 A   4/1998
(Continued)

OTHER PUBLICATIONS

International Search Report of PCT/JP2009/070008 mailed Feb. 2, 2010.

*Primary Examiner* — Eduardo A Rodela
(74) *Attorney, Agent, or Firm* — Kenyon & Kenyon LLP

(57) ABSTRACT

A semiconductor device and a method of producing the same, wherein a joining member and a joined member are bonded by means of brazing in a way such that no voids are left inside the joining layer. The semiconductor device comprises a joined member and a joining member which is joined to the joined member by means of brazing. The joined member is provided with a through hole which is open on the joining surface with the joining member, and a path communicating with the through hole is provided on at least one of the joining surface of the joining member with the joined member or the joining surface of the member with the joining member.

4 Claims, 13 Drawing Sheets

(52) U.S. Cl.
CPC .............. *H01L 2924/01006* (2013.01); *H01L 2924/01033* (2013.01); *H01L 24/95* (2013.01); *H01L 2924/01004* (2013.01); *H01L 2924/01013* (2013.01); *H01L 2224/838* (2013.01); *H01L 21/4803* (2013.01); *H01L 2224/32057* (2013.01); *H01L 2924/01005* (2013.01); *H01L 2924/15151* (2013.01); *H01L 24/83* (2013.01); *H01L 24/29* (2013.01); *H01L 2924/014* (2013.01); *H01L 2924/01082* (2013.01)

USPC ........... 257/712; 257/713; 257/714; 257/717; 257/720; 257/E23.08; 438/121; 438/122

(56) References Cited

U.S. PATENT DOCUMENTS

| | | |
|---|---|---|
| 2011/0042828 A1 | 2/2011 | Sota et al. |
| 2011/0192574 A1* | 8/2011 | Yoshikawa et al. ...... 165/104.21 |

FOREIGN PATENT DOCUMENTS

| | | |
|---|---|---|
| JP | 2002-280503 A | 9/2002 |
| JP | 2007-258605 A | 10/2007 |
| JP | 2008-311550 A | 12/2008 |
| JP | 2009-016659 A | 1/2009 |
| WO | 2009130958 A1 | 10/2009 |

* cited by examiner

SEMICONDUCTOR DEVICE AND METHOD OF PRODUCING SAME

FIELD OF THE INVENTION

The present invention relates to a semiconductor device including a joining member and a joined member joined to each other by brazing, and a method of producing the semiconductor device.

BACKGROUND OF THE INVENTION

For a semiconductor device, when a joining member such as an insulating member (an insulating substrate) is to be joined or bonded by brazing to a member to be joined (a joined member) such as a lid of a cooler, for example, a brazing material placed between the joining member and the joined member is heated to be melted. At that time, if a clearance or gap between the joining member and the joined member is uniform, the melted brazing material is wetted and spread with no regularity. When the brazing material is cooled and solidified to form a joining layer, a peripheral portion of the joining member is apt to become cold first, causing the brazing material to begin solidifying from an outer peripheral edge.

Thus, air existing in the brazing material is kept in the joining layer. This may leave voids (air layers) with unspecified width or area inside the joining layer. In case such voids are left, it is impossible to stably transfer and release the heat generated in an electronic component such as a semiconductor element to a cooler. Thus, a cooling performance of the cooler could not sufficiently be brought out on the electronic component.

Patent document 1 discloses a technique of releasing such air. To be concrete, a pair of electrodes to which an electronic component is to be soldered are formed with guide passages for air release. These guide passages open in a clearance located under the electronic component and in the outside of the electronic component. With this configuration, the air that occurs in the clearance under the electronic component when resin is supplied to form an insulating layer is released through open ends located in the outside of the electronic component via the guide passages.

RELATED ART DOCUMENTS

Patent Documents

Patent Document 1: JP 2007-258605 A

SUMMARY OF THE INVENTION

Problems to be Solved by the Invention

However, in the case where the guide passages are open in the outside of the electronic component as disclosed in Patent Document 1, outside air is liable to enter from the open ends located in the outside of the electronic component into an insulating layer formed in the clearance under the electronic component through the guide passages. Further, since the brazing material tends to begin solidifying from the outer peripheral edge when the joined member is joined to the joining member by brazing as mentioned above, the air could not be sufficiently released to the outside of the joining member. This results in remaining voids in the insulating layer formed in the clearance under the electronic component.

During joining and after joining between a joining member (e.g., the electronic component in Patent Document 1) and a joined member (e.g., the electrode in Patent Document 1), when heat is added to the joining member and the joined member which are different in linear expansion coefficient, thermal stress occurs. At that time, peeling and cracking are likely to occur particularly in an outer peripheral area of the joining portion. Therefore, in the case where the guide passage is provided to extend up to the outside of the joining portion between the joining member and the joined member as disclosed in Patent Document 1, thermal stress may concentrate on the guide passage located in the outside of the joining portion, causing deformation of the joining member and the joined member, leading to their disjoining.

The present invention has been made to solve the above problems and has a purpose to provide a semiconductor device and a method of producing the semiconductor device, whereby a joining member and a joined member are joined by brazing without leaving voids in a joining layer.

Means of Solving the Problems

To achieve the above purpose, one aspect of the invention provides a semiconductor device including a joining member and a joined member to which the joining member is joined by brazing, wherein the joined member includes a joining surface to be joined to the joining member and a through hole opening in the joining surface, and a passage communicated with the through hole is provided with at least one of a joining surface of the joining member to be joined to the joined member and the joining surface of the joined member to be joined to the joining member, the passage is provided between a position apart from an edge of a joining portion between the joining member and the joined member toward the through hole and a position of the through hole, and the passage is a groove.

According to the above configuration, the joined member is provided with the through hole opening in the joining surface to be joined to the joining member, and the passage communicated with the through hole is provided in at least one of the joining surface of the joining member to be joined to the joined member and the joining surface of the joined member to be joined to the joining member. Accordingly, in brazing the joining member and the joined member, a brazing material is guided in the passage, and wetted and spread with regularity. Thus, air which may be present in the brazing material passes through the passage and is removed through the through hole. Accordingly, the joining member and the joined member can be joined to each other by brazing so that no voids are left in the joining layer formed by solidification of the brazing material.

Further, the passage is provided between the position apart from the edge of the joining portion between the joining member and the joined member toward the through hole and the position of the through hole.

Thus, the passage is not open in the position corresponding to the outer peripheral edge of the joining member during joining between the joining member and the joined member. Therefore, there is no possibility that outside air enters in the passage, thus more reliably ensuring that no voids are left in the joining layer.

The joining member and the joined member are joined to each other more reliably with the brazing material. Even when heat is added to the joining member and the joined member during joining and after joining, therefore, the joining member and the joined member are not disjoined.

Further, the brazing material is easy to be guided in the groove, and wetted and spread, thereby allowing air which may be present in the brazing material to easily pass through the groove and be removed through the through hole.

(Deleted)

(Deleted)

In the above configuration, preferably, the passage has a depth gradually increasing toward the through hole.

Herein, the brazing material has the property of being solidified from a portion located in a small clearance to a portion located in a large clearance.

According to the above configuration, therefore, the passage has the depth gradually increasing as it approaches to the through hole. The brazing material will be wetted and spread toward the through hole. Thus, air which may be present in the brazing material is more reliably removed through the through hole. This can further ensure that no voids are left in the joining layer.

(Deleted)

(Deleted)

In the above configuration, preferably, the joined member is a lid member of a cooler for cooling an electronic component placed on the joining member.

According to the above configuration, no voids are left in the joining layer between the lid member of the cooler and the joining member. Thus, the electronic component placed on the joining member can be more reliably cooled.

In the above configuration, preferably, the through hole includes an open end that opens in a surface opposite the joining surface of the joined member and is located on a gap between a plurality of fins provided in the cooler.

According to the above configuration, the through hole has the open end that opens in the surface opposite the joining surface of the joined member and is located on the gap between the fins. This makes it possible to release the air which may be present in the brazing material into the cooler. This further ensures that no voids are left in the joining layer.

To achieve the above object, another aspect of the invention provides a method of producing a semiconductor device including a joining member and a joined member joined to each other by brazing, wherein the joined member is formed with a through hole that opens in a joining surface to be joined to the joining member, a passage communicated with the through hole is provided in at least one of a joining surface of the joining member to be joined to the joined member and the joining surface of the joined member to be joined to the joining member, the method including: placing a brazing material between the joining surface of the joining member to be joined to the joined member and the joining surface of the joined member to be joined to the joining member, and melting and solidifying the brazing material to join the joining member and the joined member to each other, wherein the passage is provided between a position apart from an edge of a joining portion between the joining member and the joined member toward the through hole and a position of the through hole, and the passage is a groove.

According to the above configuration, the joined member is formed with a through hole that opens in a joining surface to be joined to the joining member, a passage communicated with the through hole is provided in at least one of a joining surface of the joining member to be joined to the joined member and the joining surface of the joined member to be joined to the joining member. The method includes: placing a brazing material between the joining surface of the joining member to be joined to the joined member and the joining surface of the joined member to be joined to the joining member, and melting and solidifying the brazing material to join the joining member and the joined member to each other. Therefore, in joining the joining member and the joined member, the brazing material is guided in the passage, and wetted and spread out with regularity. Accordingly, the air which may be present in the brazing material is allowed to pass through the passage and be removed through the through hole. Thus, the joining member and the joined member can be joined by brazing so that no voids are left in the joining layer formed by solidification of the brazing material.

Further, the passage is provided between the position apart from the edge of the joining portion between the joining member and the joined member toward the through hole and the position of the through hole.

Thus, the passage is not open in the position corresponding to the outer peripheral edge of the joining member during joining between the joining member and the joined member. Therefore, there is no possibility that outside air enters in the passage, thus more reliably ensuring that no voids are left in the joining layer.

The joining member and the joined member are joined to each other more reliably with the brazing material. Even when heat is added to the joining member and the joined member during joining and after joining, therefore, the joining member and the joined member are not disjoined.

Further, the brazing material is easy to be guided in the groove, and wetted and spread, thereby allowing air which may be present in the brazing material to easily pass through the groove and be removed through the through hole.

Effects of the Invention

According to a semiconductor device and a method of producing the semiconductor device according to the present invention, a joining member and a joined member can be joined to each other by brazing without leaving voids in a joining layer.

DETAILED DESCRIPTION

A detailed description of a preferred embodiment of the present invention will now be given referring to the accompanying drawings.

Figure 1:
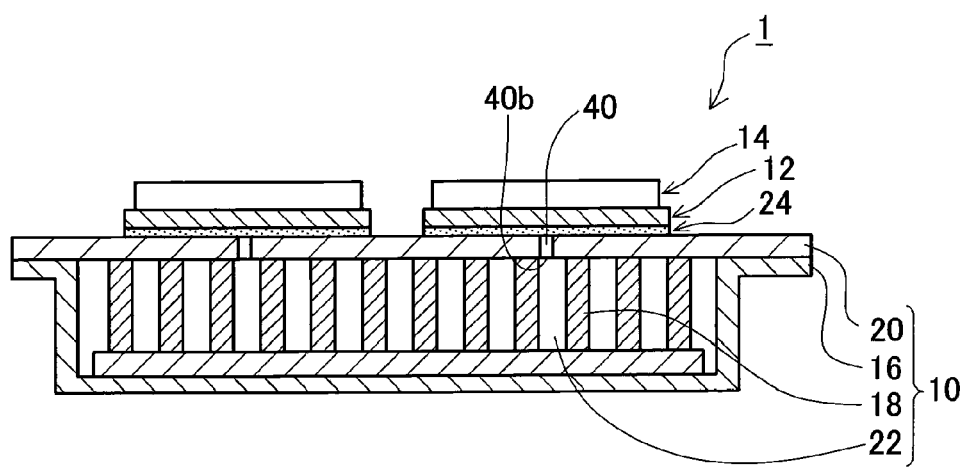
FIG. 1 is a side view of a semiconductor device of a present invention.

FIG. 1 is a side view of a semiconductor device 1 of the present invention. As shown in FIG. 1, the semiconductor device 1 includes a cooler 10, insulating members 12, electronic components 14, and others.

The cooler 10 includes a frame 16, a plurality of fins 18, lids 20, and others. The frame 16 is made of for example aluminum (linear expansion coefficient: about 25 ppm/° C.) and formed in a box-like shape. The fins 18 are arranged in the frame 16 so that adjacent fins 18 are spaced apart from each other with gaps 22. The gaps 22 serve as channels of cooling water.

The lids 20 are made of for example aluminum (linear expansion coefficient: about 25 ppm/° C.) and formed in a flat-plate shape. Each lid 20 is formed with a through hole 40 as mentioned later. An open end 40b of the through hole 40 opening on the fin 18 side is located in a position to open in a gap 22. The through hole 40 has a size enough to allow passage of air but not allow a brazing material 32 (see FIG. 3) held on the interior surface of the through hole 40 by surface tension to drop out. To be specific, the through hole 40 has a hole diameter of several millimeters or less.

The insulating members 12 are insulating substrates placed on the lid 20 of the cooler 10. A linear thermal coefficient of the insulating members 12 is for example 4 to 4.5 ppm/° C. Between the insulating members 12 and the lid 20, joining layers 24 formed of the solidified brazing material 32 (see FIG. 3) are provided. The electronic components 14 are semiconductor modules placed on the upper surfaces of the insulating members 12 and are each internally provided with a semiconductor element such as IGBT and a diode to control a large amount of power.

With the above configuration, the electronic components 14 in the semiconductor device 1 are cooled in the following manner. Heat generated in each electronic component 14 is transferred to the fins 18 via the insulating member 12, the joining layer 24, and the lid 20. At that time, cooling water not shown is supplied through an inlet port 26 (see FIG. 2) provided in the lid 20 of the cooler 10. When the cooling water flows in the gaps 22, therefore, heat exchange is performed between the cooling water and the fins 18. Thus, the heat generated in the electronic components 14 is absorbed by the cooling water. Thereafter, the cooling water absorbing the heat is discharged out through an outlet port 28 (see FIG. 2) provided in the lid 20. As above, the heat generated in the electronic components 14 is released out of the semiconductor device 1 and the electronic components 14 are cooled.

In the present embodiment, one example of joining between a joining member and a joined member is explained below as joining between the insulating members 12 and the lid 20.

Figure 2:
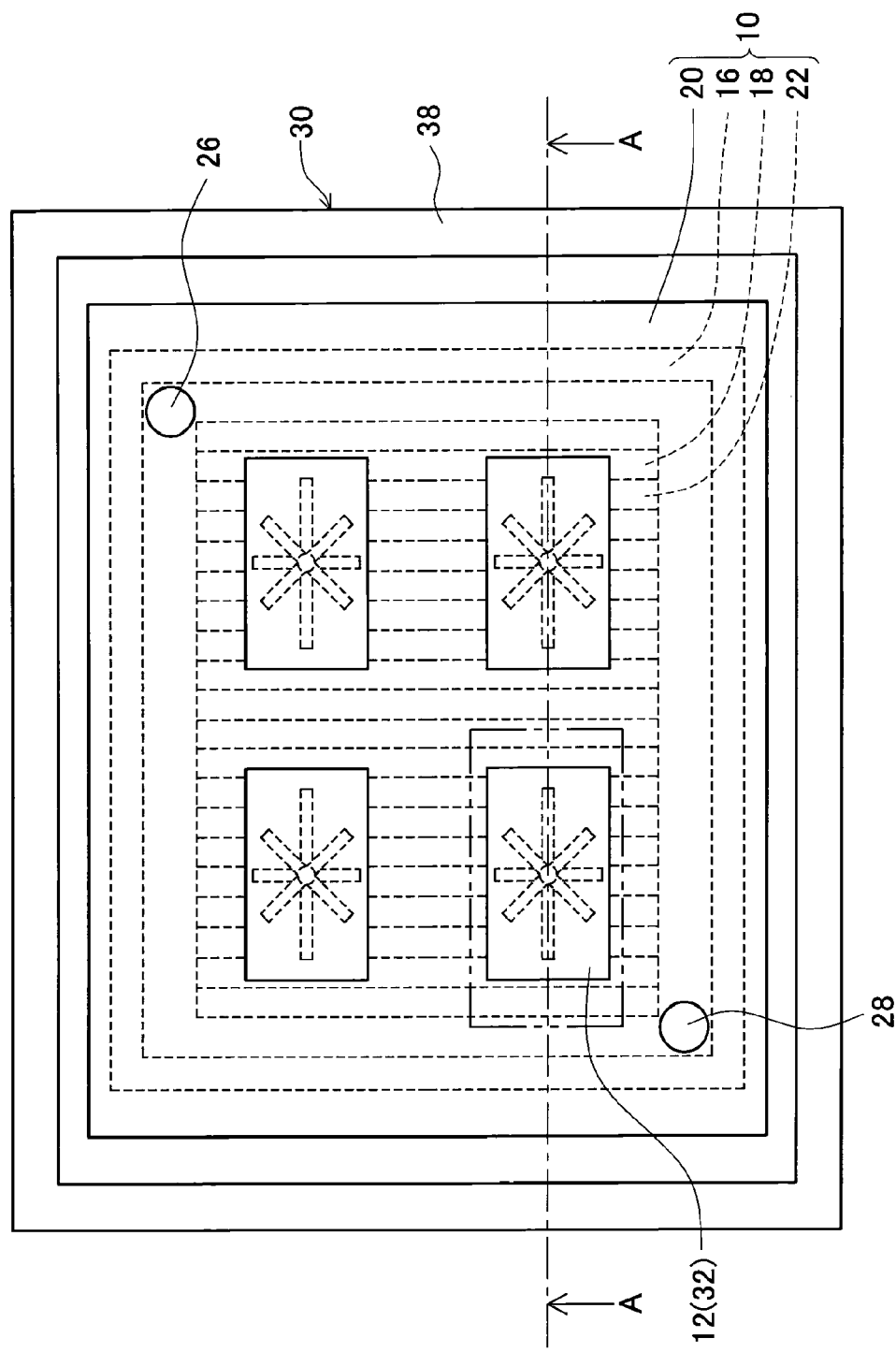
FIG. 2 is a top view showing a state where a cooler and an insulating member are mounted in a brazing jig.
Figure 3:
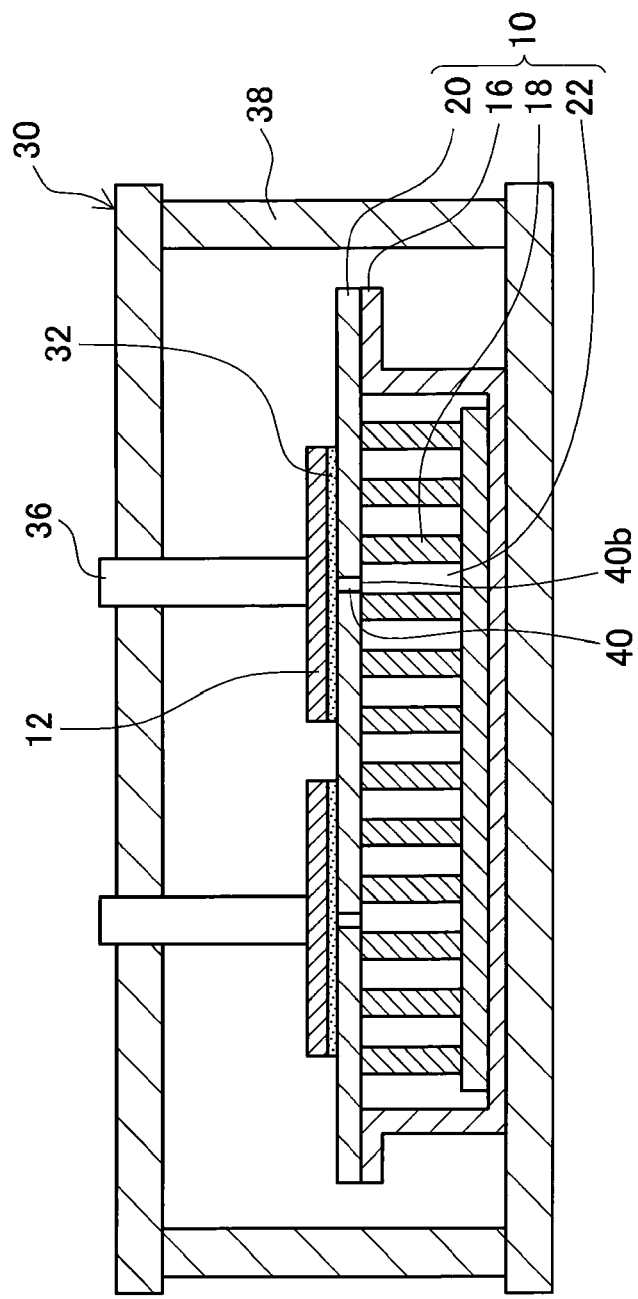
FIG. 3 is a sectional view taken along a line A-A in FIG. 2.

FIGS. 2 and 3 are views showing a part of a process of producing the semiconductor device 1, showing a state where the cooler 10 and the insulating members 12 are mounted in a brazing jig 30. Specifically, FIG. 2 is a top view and FIG. 3 is a sectional view taken along a line A-A in FIG. 2. In FIG. 2, press members 36 are not illustrated for convenience of explanation.

As shown in FIG. 2, four insulating members 12 in total are provided to one cooler 10.

As shown in FIG. 3, the insulating members 12 are placed on the lid 20 by interposing the brazing material 32 (a metal joining material and so on) and further the press members 36 supported in the brazing jig 30 are disposed respectively on the insulating members 12.

The brazing jig 30 has for example an outer frame 38 having a box-like shape as shown in FIG. 3 and is configured to place the cooler 10 inside the outer frame 38.

The brazing jig 30 configured as above, in which the cooler 10 and the insulating members 12 are mounted, is put in a heating furnace not shown. An internal temperature of the heating furnace is increased to a melting temperature of the brazing material 32 or higher, thereby melting the brazing material 32, and then is decreased to the melting temperature of the brazing material 32 or lower. Accordingly, the brazing material 32 is melted once, wetted and spread in clearances between the insulating members 12 and the lid 20 and then solidified, forming the joining layers 24 (see FIG. 1). Thus, the insulating members 12 and the lid 20 are joined or bonded to one another by brazing.

Therefore, the following explanation is given to examples of the present invention related to the above joining between the insulating members 12 and the lid 20 of the cooler 10 by brazing.

EXAMPLE 1

Figure 4:
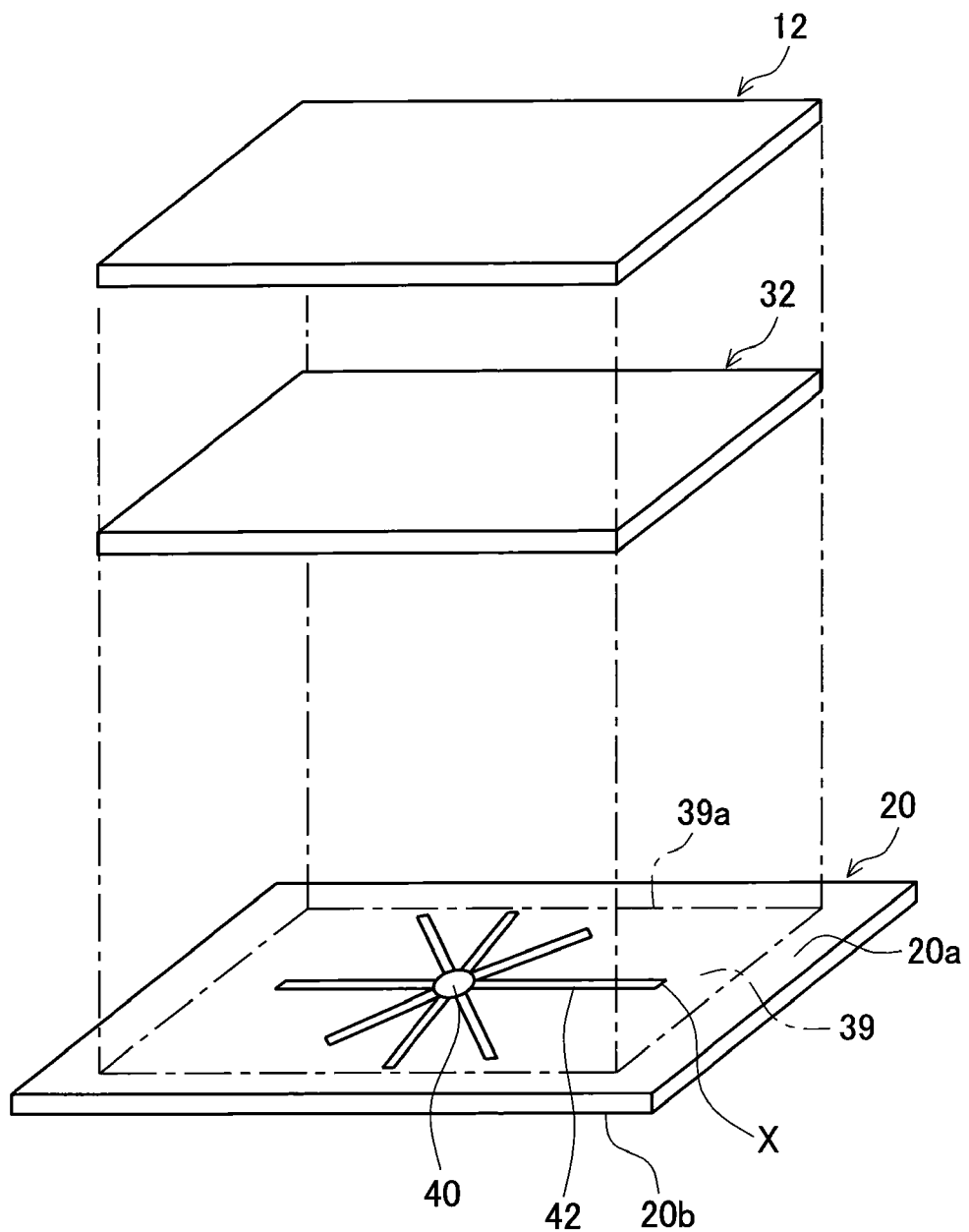
FIG. 4 is a perspective view showing the insulating member and a lid of the cooler in an exploded state in Example 1.
Figure 5:
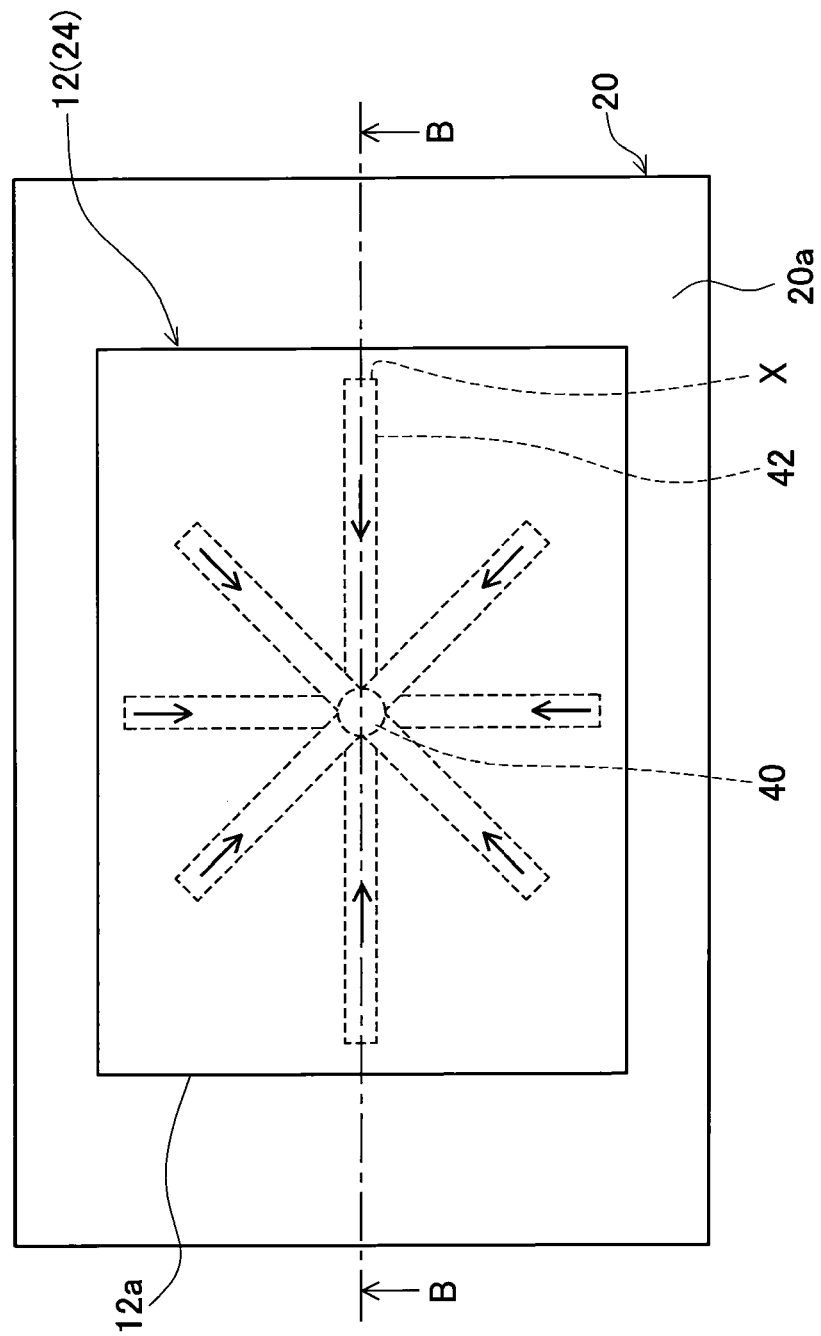
FIG. 5 is a top view showing the insulating member and the lid of the cooler in a joined state in Example 1.
Figure 6:
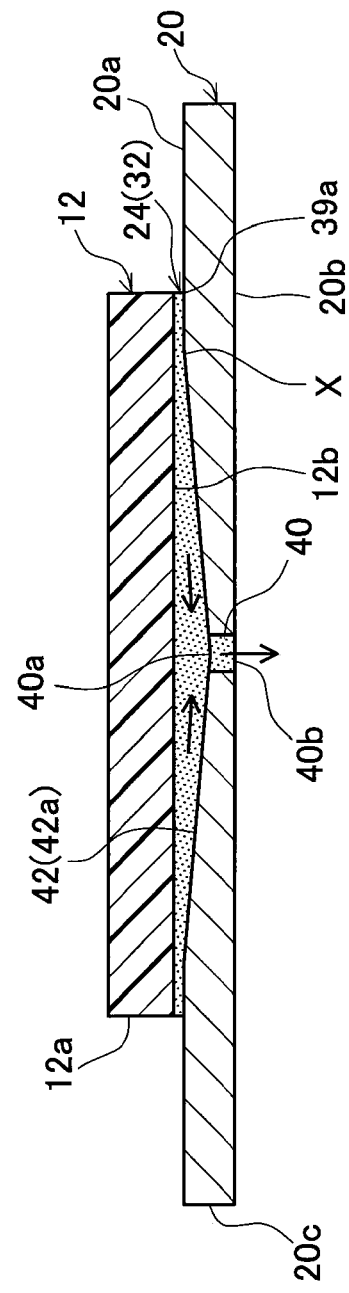
FIG. 6 is a side view showing the insulating member and the lid of the cooler in the joined state in Example 1.

In Example 1, FIGS. 4 to 6 show one insulating member 12 indicated by a chain double-dashed line in FIG. 2 to show a joining portion 39 between the insulating member 12 and the lid 20. Specifically, FIG. 4 is a perspective view showing the insulating member 12 and the lid 20 in an exploded state. FIGS. 5 and 6 are views showing the insulating member 12 and the lid 20 in a joining state; specifically, FIG. 5 is a top view and FIG. 6 is a sectional view taken along a line B-B in FIG. 5.

As shown in FIGS. 4 to 6, the lid 20 is provided with the through hole 40 and grooves 42. The lid 20 includes a joining surface 20a to be joined to the insulating member 12 and the other surface 20b opposite the joining surface 20a. The surface 20b is located on the side where the fins 18 are placed.

The through hole 40 is formed through the lid 20 in a pressing direction of the press member 36 (see FIG. 3) and includes an open end 40a opening in the joining surface 20a, i.e., on the joining surface 20a side, and an open end 40b opening in the other surface 20b, i.e., on the fin 18 side. The open end 40b is located in a position corresponding to the gap 22 between the fins 18 in an assembled state as the cooler 10 as shown in FIG. 1. In the example shown in FIGS. 4 to 6, the through hole 40 is provided one per insulating member 12 and located near the center of the joining portion 39 between the insulating member 12 and the lid 20. However, not limited to the example shown in FIGS. 4 to 6, the through hole 40 may be provided anywhere in the joining portion 39 between the insulating member 12 and the lid 20 other than the center thereof. As an alternative, a plurality of through holes 40 may be provided in one area in the joining portion 39 between the insulating member 12 and the lid 20.

The grooves 42 are formed in the joining surface 20a of the lid 20 by fine processing using laser or the like. The grooves 42, which are one example of a passage communicated with the through hole 40, are arranged to extend radially from the through hole 40 as a center. In the example shown in FIGS. 4 to 6, for one through hole 40, eight grooves 42 in total are arranged in eight positions spaced at equal intervals in a circumferential direction about the center point of the through hole 40. The total number of grooves 42 is not limited to eight and, for example, may be appropriately determined according to the area of the joining surface 12b of the insulating member 12 to be joined to the lid 20.

Each groove 42 is formed between a position X at a predetermined distance apart from an edge 39a of the joining portion 39 between the insulating member 12 and the lid 20 toward the through hole 40 and the position of the through hole 40 as shown in FIGS. 4 to 6. Thus, when the insulating member 12 is to be joined to the lid 20, the grooves 42 are not open in positions corresponding to an outer peripheral edge 12a of the insulating member 12.

As shown in FIG. 6, furthermore, a bottom 42a of each groove 42 is sloped downward from the edge 39a of the joining portion 39 between the insulating member 12 and the lid 20 toward the through hole 40. Accordingly, the depth of each groove 42 gradually increases as it approaches the through hole 40. Alternatively, the grooves 42 may be designed to each have a uniform depth without making the bottoms 42a slant.

The above configuration in Example 1 can provide the following operations and effects.

During melting and solidifying, the brazing material 32 placed between the joining surfaces 12b and the joining surface 20a is guided in the grooves 42 and hence wetted and spread out regularly. Accordingly, the air which may be present in the brazing material 32 is guided in the grooves 42 and passes through the grooves 42, and then released into the cooler 10 through the through holes 40.

Especially, the bottom 42a of each groove 42 is sloped downward from the edge 39a side of the joining portion 39 between the insulating member 12 and the lid 20 toward the through hole 40 so that the depth of each groove 42 gradually increases as it approaches toward the through hole 40. Herein, the brazing material 32 has the property of being solidified from a portion located in a small clearance between the joining member and the joined member toward a portion located in a large clearance. Accordingly, the air which may be present in the brazing material 32 is allowed to flow toward a large-depth portion of each groove 42 near the through hole 40 and then be released into the cooler 10 through the through hole 40. Since the open end 40b of the through hole 40 is located on the gap 22 between the fins 18, the air which may be present in the brazing material 32 is released into the gap 22. Thus, no voids are left in the joining layer 24 formed by solidification of the brazing material 32. Therefore, the heat generated from the electronic component 14 stably transferred and released to the cooler 10, so that the electronic component 14 and others can be cooled stably.

Further, the groove 42 is provided between the position X at the predetermined distance apart from the edge 39a of the joining portion 39 between the insulating member 12 and the lid 20 toward the through hole 40 and the position of the through hole 40. Thus, the grooves 42 are not open in the positions corresponding to the outer peripheral edge 12a when the insulating member 12 is joined to the lid 20. Consequently, there is no possibility that outside air enters in the grooves 42. This can further ensure that no voids are left in the joining layer 24.

Furthermore, the grooves 42 are not open in the positions corresponding to the outer peripheral edge 12a of each insulating member 12 during joining of the insulating members 12 to the lid 20. Even in the edge 39a of each joining portion 39, the insulating members 12 and the lid 20 are reliably joined to each other with the brazing material 32. Accordingly, even when thermal stress occurs by the heat applied to the insulating members 12 and the lid 20 during and after joining, the thermal stress does not concentrate on specific portions. Thus, the insulating members 12 and the lid 20 are not disjoined.

When the brazing material 32 held on the interior surface of each through hole 40 by surface tension is solidified, finally, it serves as a stopper that blocks off the through holes 40. Accordingly, there is no possibility that the cooling water flowing through the cooler 10 leaks to the outside through the through holes 40.

EXAMPLE 2

Figure 7:
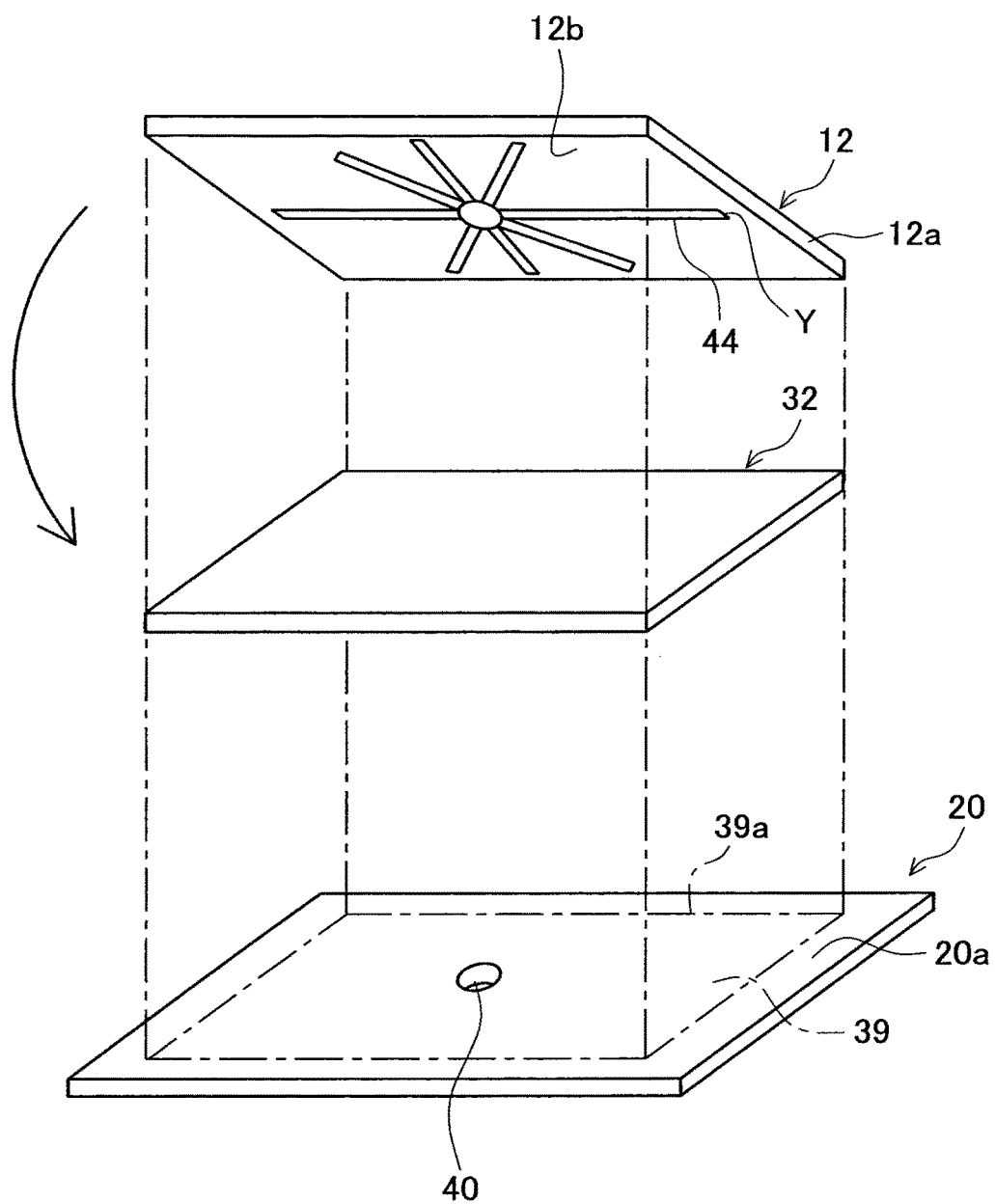
FIG. 7 is a perspective view showing an insulating member and a lid of a cooler in an exploded state in Example 2.
Figure 8:
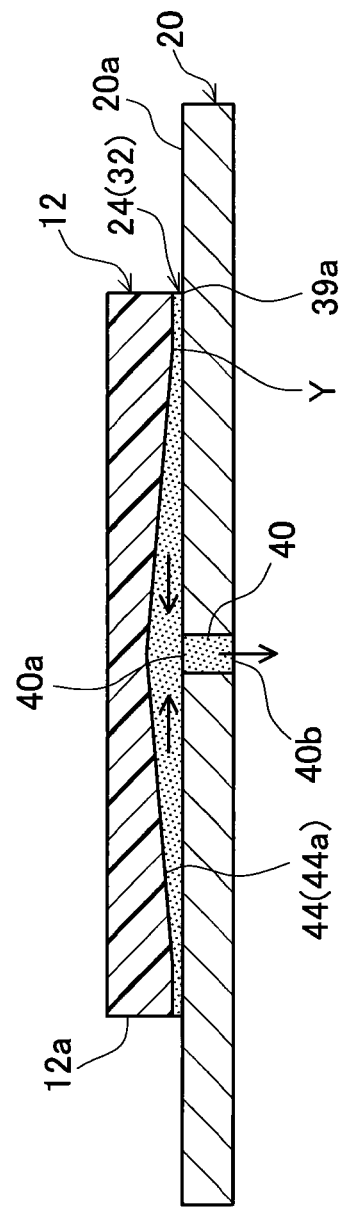
FIG. 8 is a side view showing the insulating member and the lid of the cooler in a joined state in Example 2.

In Example 2, FIGS. 7 and 8 show one insulating member 12 indicated by a chain double-dashed line in FIG. 2 to show a joining portion between the insulating member 12 and the lid 20. Specifically, FIG. 7 is a perspective view showing the insulating member 12 and the lid 20 in an exploded state. FIG. 8 is a view showing the insulating member 12 and the lid 20 in a joining state, corresponding to a sectional view taken along a line B-B in FIG. 5. A top view of this example is identical to FIG. 5 and hence is omitted herein.

As shown in FIGS. 7 and 8, the lid 20 is provided with the through hole 40 and the insulating member 12 is provided with grooves 44.

In this example, the details of the through hole 40 are identical to those in Example 1 and omitted herein.

The grooves 44 are formed in the joining surface 12b of the insulating member 12 by fine processing using laser or the like. The grooves 44 are arranged to extend radially from a position corresponding to the position in which the through hole 40 is located when the insulating member 12 and the lid 20 are joined. Accordingly, the grooves 44 are communicated with the through hole 40 when the insulating member 12 and the lid 20 are joined. As above, the grooves 44 are one example of a passage communicated with the through hole 40.

In the example shown in FIG. 7, the through hole 40 is provided in the position corresponding to the center of the insulating member 12 when the insulating member 12 and the lid 20 are joined. Thus, the grooves 44 are arranged radially from the position near the center of the insulating member 12.

In the example shown in FIG. 7, per one insulating member 12, eight grooves 44 in total are arranged in eight positions spaced at equal intervals in a circumferential direction about near the center of the insulating member 12. The total number of grooves 44 is not limited to eight and, for example, may be appropriately determined according to the area of the joining surface 12b of the insulating member 12.

It is to be noted that the brazing material 32 is placed between the joining surface 12b of the insulating member 12 and the joining surface 20a of the lid 20 as shown in FIG. 7 to join the insulating member 12 and the lid 20 to each other.

Each groove 44 is formed between a position Y at a predetermined distance apart from the outer peripheral edge 12a of the insulating member 12 toward the center and the center position of the insulating member 12, as shown in FIGS. 7 and 8. This means that the groove 44 is provided between the position Y at the predetermined distance apart from the outer peripheral edge 12a of the insulating member 12 toward the through hole 40 and the position of the through hole 40 as shown in FIG. 8. Accordingly, the grooves 44 are not open in the outer peripheral edge 12a of the insulating member 12.

Furthermore, as shown in FIG. 8, a bottom 44a of each groove is sloped upward from the outer peripheral edge 12a toward the center of the insulating member 12. Accordingly, the depth of each groove 44 gradually increases as it approaches the through hole 40. As an alternative, the grooves 44 may be designed to each have a uniform depth without making the bottoms 44a slant.

The above configuration in Example 2 can provide the following operations and effects.

During melting and solidifying, the brazing material 32 placed between the joining surface 12b and the joining surface 20a is guided in the grooves 44 and hence wetted and spread regularly. Accordingly, the air which may be present in the brazing material 32 is guided in the grooves 44 to pass through the grooves 44, and then released into the cooler 10 through the through hole 40.

Especially, the bottom 44a of each groove 44 is sloped upward from the outer peripheral edge 12a toward the center of the insulating member 12 so that the depth of each groove 44 gradually increases as it approaches toward the vicinity of the center of the insulating member 12. Herein, the brazing material 32 has the property of being solidified from a portion located in a small clearance between the joining member and the joined member toward a portion located in a large clearance. Accordingly, the air which may be present in the brazing material 32 is allowed to flow toward a large-depth portion of each groove 44 near the center of the insulating member 12 and then released into the cooler 10 through the through hole 40. Since the open end 40b of the through hole 40 is located on the gap 22 between the fins 18, the air which may be present in the brazing material 32 is released into the gap 22. Thus, no voids are left in the joining layer 24 formed by solidification of the brazing material 32. Therefore, the heat generated from the electronic component 14 can be stably transferred and released to the cooler 10, so that the electronic component 14 and others can be cooled stably.

Further, the groove 44 is provided between the position Y at the predetermined distance apart from the outer peripheral edge 12a of the insulating member 12 toward the center and the center of the insulating member 12. Thus, the grooves 44 are not open in the outer peripheral edge 12a. Consequently, there is no possibility that outside air enters in the grooves 44. This can further ensure that no voids are left in the joining layer 24.

Furthermore, the grooves 44 are not open in the outer peripheral edge 12a and thus the insulating member 12 and the lid 20 are reliably joined to each other with the brazing material 32 even in the edge 39a of the joining portion 39. Accordingly, even when thermal stress occurs by the heat applied to the insulating member 12 and the lid 20 during and after joining, the thermal stress does not concentrate on specific portions. Thus, the insulating member 12 and the lid 20 are not disjoined.

When the brazing material 32 held on the interior surface of each through hole 40 by surface tension is solidified, finally, it serves as a stopper that blocks off the through holes 40. Accordingly, there is no possibility that the cooling water flowing through the cooler 10 leaks to the outside through the through holes 40.

EXAMPLE 3

Figure 9:
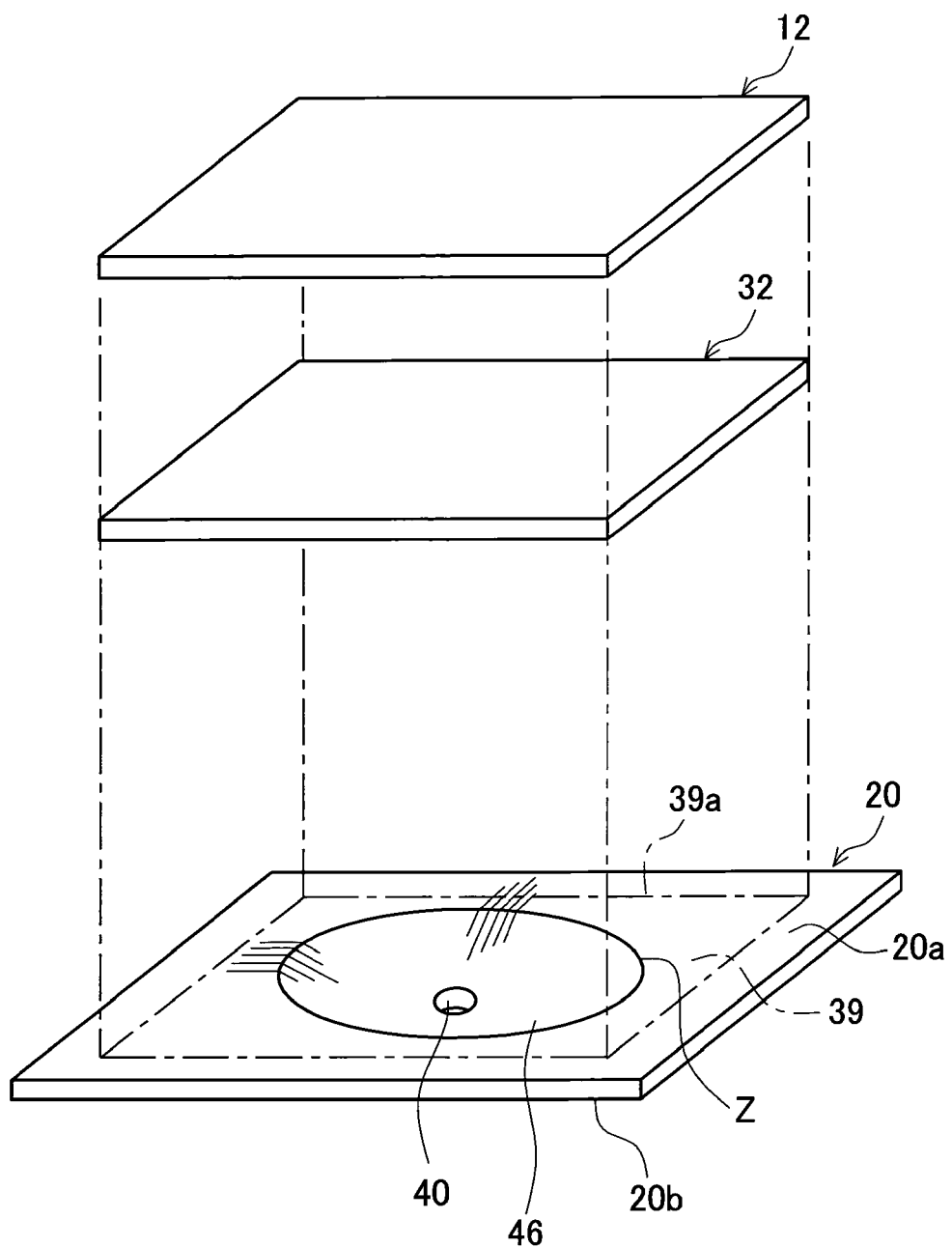
FIG. 9 is a perspective view showing an insulating member and a lid of a cooler in an exploded state in Example 3.
Figure 10:
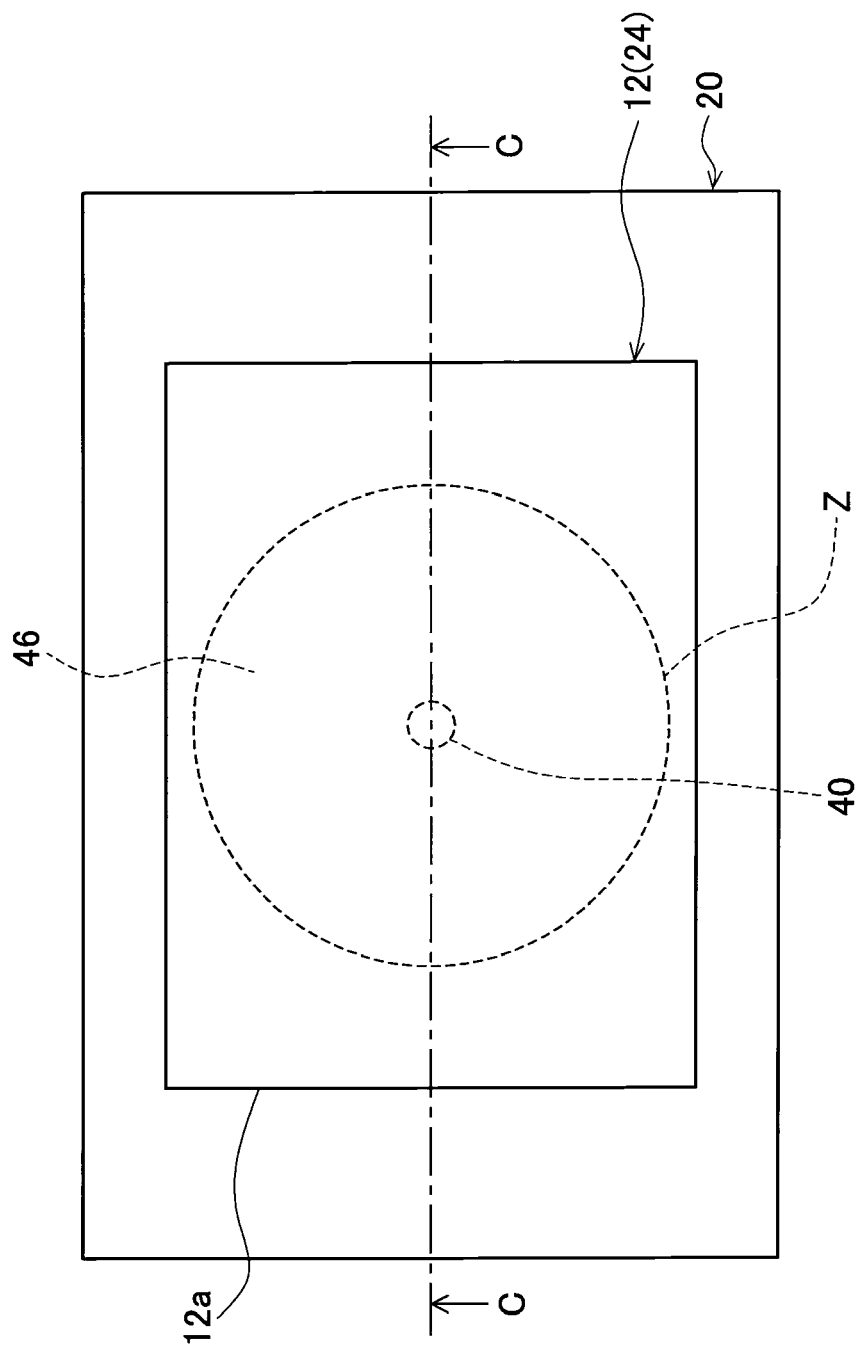
FIG. 10 is a top view showing the insulating member and the lid of the cooler in a joined state in Example 3.

In Example 3, FIGS. 9 and 10 show one insulating member 12 indicated by a chain double-dashed line in FIG. 2 to show a joining portion between the insulating member 12 and the lid 20. Specifically, FIG. 9 is a perspective view showing the insulating member 12 and the lid 20 in an exploded state. FIG. 10 is a top view showing the insulating member 12 and the lid 20 in a joining state. A sectional view taken along a line C-C in FIG. 10 is identical to FIG. 6 and omitted herein.

As shown in FIGS. 9 and 10, the lid 20 is provided with the through hole 40 and a sloping portion 46.

In this example, the details of the through hole 40 are identical to those in Example 1 or Example 2 and omitted herein.

The sloping portion 46 is a cone-shaped sloping hollow centered at the through hole 40 as shown in FIG. 9. This sloping portion 46 is one example of a passage communicated with the through hole 40 as with the grooves 42 of Example 1 and the grooves 44 of Example 2. The sloping portion 46 is provided between a position Z at a predetermined distance apart from the edge 39a of the joining portion 39 between the insulating member 12 and the lid 20 toward the through hole 40 and the position of the through hole 40. Accordingly, the sloping portion 46 is not open in the position corresponding to the outer peripheral edge 12a of the insulating member 12 when the insulating member 12 and the lid 20 are joined.

The above configuration in Example 3 can provide the following operations and effects.

During melting and solidifying, the brazing material 32 placed between the joining surface 12b and the joining surface 20a is guided in the sloping portion 46 and hence wetted and spread regularly. Accordingly, the air which may be present in the brazing material 32 is guided in the sloping portion 46 to pass through the sloping portion 46, and then released into the cooler 10 through the through hole 40.

Especially, the sloping portion 46 is sloped downward from the edge 39a of the joining portion 39 between the insulating member 12 and the lid 20 toward the through hole 40 so that the depth of the sloping portion 46 is gradually larger as it approaches toward the through hole 40. Herein, the brazing material 32 has the property of being solidified from a portion located in a small clearance between the joining member and the joined member to a portion located in a large clearance. Accordingly, the air which may be present in the brazing material 32 is released into the cooler 10 through the through hole 40. Since the open end 40b of the through hole 40 is located on the gap 22 between the fins 18, the air which may be present in the brazing material 32 is released into the gap 22. Thus, no voids are left in the joining layer 24 formed by solidification of the brazing material 32. Therefore, the heat generated from the electronic component 14 can be stably transferred and released to the cooler 10, so that the electronic component 14 and others can be cooled stably.

Further, the sloping portion 46 is provided between the position Z at the predetermined distance apart from the edge 39a of the joining portion 39 between the insulating member 12 and the lid 20 toward the through hole 40 and the position of the through hole 40. Thus, the sloping portion 46 is not open in the position corresponding to the outer peripheral edge 12a during joining of the insulating member 12 to the lid 20. Consequently, there is no possibility that outside air enters in the sloping portion 46. This can further ensure that no voids are left in the joining layer 24.

Furthermore, as in Examples 1 and 2, when the brazing material 32 held on the interior surface of each through hole 40 by surface tension is solidified, finally, it serves as a stopper that blocks off the through holes 40. Accordingly, there is no possibility that the cooling water flowing through the cooler 10 leaks to the outside through the through holes 40.

EXAMPLE 4

Figure 11:
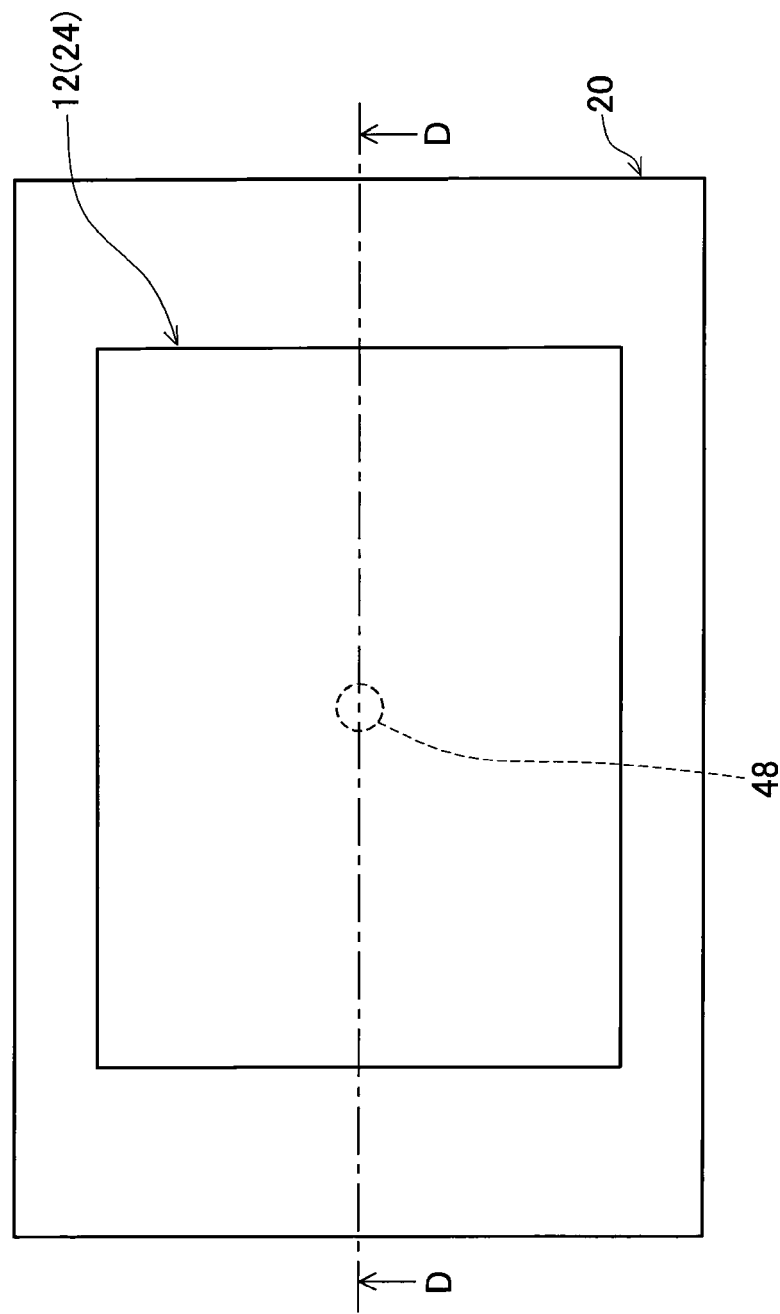
FIG. 11 is a top view showing an insulating member and a lid of a cooler in a joined state in Example 4.
Figure 12:
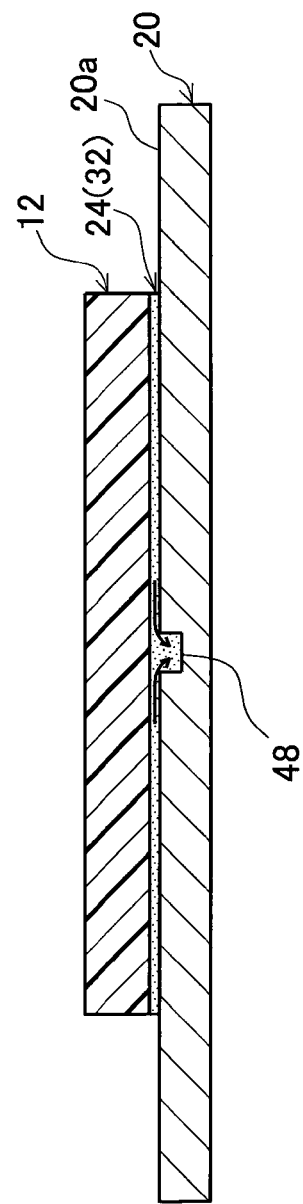
FIG. 12 is a side view showing the insulating member and the lid of the cooler in the joined state in Example 4.

In Example 4, FIGS. 11 and 12 show one insulating member 12 indicated by a chain double-dashed line in FIG. 2 to show a joining portion between the insulating member 12 and the lid 20. Specifically, FIG. 11 is a top view and FIG. 12 is a sectional view taken along a line D-D in FIG. 11.

Figure 13:
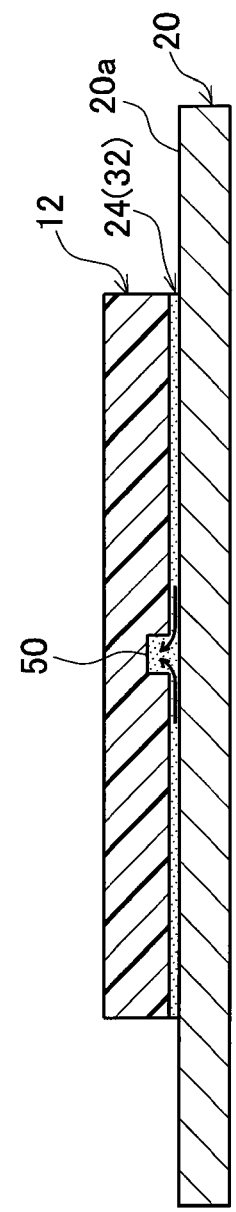
FIG. 13 is a view showing another example of Example 4.

As shown in FIGS. 11 and 12, the lid 20 is provided with a single minute recess 48 near the center of the insulating member 12 when the insulating member 12 and the lid 20 are joined. As an alternative, as shown in FIG. 13, a single recess 50 may be provided near the center of the insulating member 12. The position of the recess 48 or the recess 50 is not limited to the vicinity of the center of the insulating member 12. Further, a plurality of such recesses may also be provided.

The above configuration in Example 4 can provide the following operations and effects.

The air which may be generated in the joining layer 24 when the brazing material 32 is melted and then solidified from its peripheral portion intensively collects in the recess 48 or 50. This can ensure a joining rate in portions other than the recess 48 or 50. Accordingly, the insulating member 12 and the lid 20 can be joined reliably by brazing.

The above embodiments are mere examples and do not give any limitations to the present invention. The present invention may be embodied in other specific forms without departing from the essential characteristics thereof.

In the above examples, the insulating member 12 is directly joined to the lid 20 of the cooler 10. As an alternative, a metal plate not shown may be interposed between the lid 20 and the insulating member 12. In this case, instead of the insulating member 12, the metal plate is formed with grooves, recesses, or the like.

At the same time as joining between the insulating member 12 and the lid 20 of the cooler 10 in the aforementioned Examples 1 to 4, brazing joining may also be performed between the frame 16 and the lid 20 of the cooler 10 and between the fins 18 and the lid 20 of the cooler 10.

The present invention may also be applied to a joined member other than the lid 20 of the cooler 10.

Furthermore, it may be arranged that the lid 20 of the cooler 10 is provided with the grooves 42 and simultaneously the insulating member 12 is provided with the grooves 44.

DESCRIPTION OF THE REFERENCE SIGNS

1 Semiconductor device
10 Cooler
12 Insulating member
12*a* Outer peripheral edge
12*b* Joining surface
14 Electronic component
18 Fin
20 Lid
20*a* Joining surface
20*b* Surface
22 Gap
24 Joining layer
32 Brazing material
39 Joining portion
39*a* Edge
40 Through hole
40*a* Open end
40*b* Open end
42 Groove
42*a* Bottom
44 Groove
44*a* Bottom
46 Sloping portion
48 Recess
50 Recess

The invention claimed is:

1. A semiconductor device including a joining member and a joined member to which the joining member is joined by brazing,
    wherein a joining portion is an overlap between the joining member and the joined member across which the joined member is joined to the joining member and wherein the joined member includes a through hole opening surrounded by the joining portion,
    wherein a groove communicated with the through hole is formed in at least one of a joining surface of the joining member to be joined to the joined member and a joining surface of the joined member to be joined to the joining member,
    wherein the groove extends from a location of the through hole and stops at a predetermined distance away from an edge of the joining portion between the joining member and the joined member,
    wherein the joined member is a lid member of a cooler for cooling an electronic component placed on the joining member.

2. The semiconductor device according to claim 1, wherein the groove has a depth gradually increasing toward the through hole.

3. The semiconductor device according to claim 1, wherein the through hole includes an open end that opens in a surface opposite the joining surface of the joined member and is located in a gap between a plurality of fins provided in the cooler.

4. A method of producing a semiconductor device including a joining member and a joined member joined to each other by brazing, wherein
    the joined member is formed with a through hole that is surrounded by a joining surface of the joined member to be joined to the joining member,
    a groove communicated with the through hole is formed in at least one of a joining surface of the joining member to be joined to the joined member and a joining surface of the joined member to be joined to the joining member,
    the method including:
    placing a brazing material between the joining surface of the joining member to be joined to the joined member and the joining surface of the joined member to be joined to the joining member, and
    melting and solidifying the brazing material to join the joining member and the joined member to each other,
    wherein the groove extends from a location of the through hole and stops at a predetermined distance away from an edge of a joining portion between the joining member and the joined member, and
    wherein the joining portion is an overlap between the joining member and the joined member across which the joined member is joined to the joining member,
    wherein the joined member is a lid member of a cooler for cooling an electronic component placed on the joining member.

* * * * *